(12) United States Patent
Lin et al.

(10) Patent No.: US 9,998,148 B2
(45) Date of Patent: Jun. 12, 2018

(54) TECHNIQUES FOR LOW COMPLEXITY TURBO PRODUCT CODE DECODING

(71) Applicant: SK Hynix Inc., Gyeonggi-do (KR)

(72) Inventors: Yi-Min Lin, San Jose, CA (US); Aman Bhatia, San Jose, CA (US); Naveen Kumar, San Jose, CA (US); Johnson Yen, Fremont, CA (US)

(73) Assignee: SK Hynix Inc., Gyeonggi-do (KR)

( * ) Notice: Subject to any disclaimer, the term of this patent is extended or adjusted under 35 U.S.C. 154(b) by 54 days.

(21) Appl. No.: 15/159,331

(22) Filed: May 19, 2016

(65) Prior Publication Data

US 2017/0155407 A1     Jun. 1, 2017

Related U.S. Application Data

(60) Provisional application No. 62/261,806, filed on Dec. 1, 2015.

(51) Int. Cl.
| | |
|---|---|
| *H03M 13/00* | (2006.01) |
| *H03M 13/15* | (2006.01) |
| *H03M 13/29* | (2006.01) |

(52) U.S. Cl.
CPC ..... *H03M 13/152* (2013.01); *H03M 13/1525* (2013.01); *H03M 13/1575* (2013.01); *H03M 13/2918* (2013.01); *H03M 13/2963* (2013.01)

(58) Field of Classification Search
None
See application file for complete search history.

(56) References Cited

U.S. PATENT DOCUMENTS

| | | | |
|---|---|---|---|
| 7,012,974 B1 | 3/2006 | Liu | |
| 8,832,524 B2 * | 9/2014 | Bennett | G06F 11/1076 714/752 |

(Continued)

OTHER PUBLICATIONS

Megha.M.S., Titled "Iterative Decoding Algorithm for Turbo Product Codes", International Journal of Innovative Research in Advanced Engineering (IJIRAE), Apr. 2014, pp. 151-154, vol. 1 Issue 2, India, 4 pages.

(Continued)

*Primary Examiner* — Daniel McMahon
(74) *Attorney, Agent, or Firm* — Kilpatrick Townsend & Stockton LLP

(57) ABSTRACT

Techniques are described for decoding a codeword, including, obtaining a first message comprising a plurality of information bits and a plurality of parity bits, wherein the message corresponds to a turbo product code (TPC) comprising two or more constituent codes, wherein each constituent code corresponds to a class of error correcting codes capable of correcting a pre-determined number of errors, performing an iterative TPC decoding using at least one of a first decoder corresponding to a first constituent code and a second decoder corresponding to a second constituent code on the first message to generate a second message, determining if the decoding was successful. Upon determining that the TPC decoding was not successful, determining one or more error locations in the second message based on a third constituent code using a third decoder. The third decoder determines the one or more error locations in a predetermined number of clock cycles.

20 Claims, 12 Drawing Sheets

(56) References Cited

U.S. PATENT DOCUMENTS

| | | | |
|---|---|---|---|
| 9,160,373 B1 | 10/2015 | Varnica | |
| 2002/0166091 A1* | 11/2002 | Kidorf | G11B 20/18 |
| | | | 714/746 |
| 2004/0088636 A1* | 5/2004 | Cypher | G06F 11/1048 |
| | | | 714/764 |
| 2005/0204256 A1* | 9/2005 | Yeh | H03M 13/6343 |
| | | | 714/755 |
| 2006/0161830 A1* | 7/2006 | Yedidia | H03M 13/1108 |
| | | | 714/758 |
| 2008/0148115 A1* | 6/2008 | Sokolov | G06F 11/1072 |
| | | | 714/719 |
| 2014/0129899 A1* | 5/2014 | Kumar | H03M 13/2918 |
| | | | 714/755 |
| 2014/0325320 A1 | 10/2014 | Subramanian | |

OTHER PUBLICATIONS

Amruta P. Pokhare et al, Titled "Performance of Turbo Product Code Decoding in Wireless Communication", International Journal of Emerging Technology and Advanced Engineering (IJIRAE), Mar. 2014, pp. 750-755, vol. 4, Issue 3, India, 6 pages.

\* cited by examiner

TECHNIQUES FOR LOW COMPLEXITY TURBO PRODUCT CODE DECODING

CROSS-REFERENCE TO RELATED APPLICATIONS

The present application claims priority to Provisional Application No. 62/261,806 entitled "Low Complexity Multiple Dimensions TPC Hard Decoder Based On Syndrome Updating Decoding," filed Dec. 1, 2015, which is assigned to the assignee hereof and expressly incorporated by reference herein in its entirety.

TECHNICAL FIELD

The present disclosure relates generally to error correcting codes, and in particular, to an efficient decoder for Turbo Product Codes.

BACKGROUND

Reliability of storage systems such as NAND flash memories may decline as higher storage density is achieved with multi-level cell (MLC)/triple-level cell (TLC) technology. Error correcting codes (ECC) can be used in storage systems to detect and/or correct errors in the data and increase performance and efficiency of these systems. Several classes of ECC codes exist in the art, such as low density parity check codes (LDPC), turbo product codes (TPC) and the like. There is a need in the art to decrease hardware complexity and power consumption of decoders corresponding to these codes.

SUMMARY

In one example, an apparatus for decoding is disclosed. The apparatus includes, in part, a memory and a processor coupled to the memory. The processor configured to obtain a first message comprising a plurality of information bits and a plurality of parity bits. The message corresponds to a turbo product code (TPC) including two or more constituent codes. Each constituent code corresponds to a class of error correcting codes capable of correcting a pre-determined number of errors. The processor is further configured to perform an iterative TPC decoding using at least one of a first decoder corresponding to a first constituent code and a second decoder corresponding to a second constituent code on the first message to generate a second message, determine one or more error locations in the second message based on a third constituent code using a third decoder. The third decoder determines the one or more error locations in a predefined number of clock cycles.

In one example, a method for decoding is disclosed. The method includes, in part, obtaining a first message comprising a plurality of information bits and a plurality of parity bits. The message corresponds to a turbo product code (TPC) comprising two or more constituent codes. Each constituent code corresponds to a class of error correcting codes capable of correcting a pre-determined number of errors. The method further includes, performing an iterative TPC decoding using at least one of a first decoder corresponding to a first constituent code and a second decoder corresponding to a second constituent code on the first message to generate a second message, and determining if the decoding was successful. Upon determining that the TPC decoding was not successful, determining one or more error locations in the second message based on a third constituent code using a third decoder. The third decoder determines the one or more error locations in a predefined number of clock cycles.

In one example, a non-transitory processor-readable medium for decoding is disclosed. The non-transitory processor-readable medium includes, in part, processor-readable instructions configured to cause one or more processors to obtain a first message comprising a plurality of information bits and a plurality of parity bits. The message corresponds to a turbo product code (TPC) comprising two or more constituent codes. Each constituent code corresponds to a class of error correcting codes capable of correcting a pre-determined number of errors. The non-transitory processor-readable medium further includes processor-readable instructions configured to perform an iterative TPC decoding using at least one of a first decoder corresponding to a first constituent code and a second decoder corresponding to a second constituent code on the first message to generate a second message, and determine if the decoding was successful. Upon determining that the TPC decoding was not successful, determine one or more error locations in the second message based on a third constituent code using a third decoder. The third decoder determines the one or more error locations in a predefined number of clock cycles.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

The term "error correcting code (ECC)" is used herein to refer to a process of adding redundant data, or parity data, to a message, such that it can be recovered by a receiver even when a number of errors were introduced, either during the process of transmission, or storage. In general, the ECC can correct the errors up to the capability of the code being used. Error-correcting codes are frequently used in communications, as well as for reliable storage in media such as CDs, DVDs, hard disks, and random access memories (RAMs), flash memories and the like. Error correcting codes may include turbo product codes (TPC), Low density parity check codes, Bose-Chaudhuri-Hocquenghem (BCH) codes, Reed Solomon codes, and the like.

Turbo product codes (TPC) may have two or more dimensions, each dimension corresponding to a class of error correcting codes, which is referred to herein as constituent codes. As an example, a two-dimensional TPC codeword may include multiple error correcting codewords (hereinafter referred to as row codewords) corresponding to its first dimension, and multiple error correcting codewords (hereinafter referred to as column codewords) corresponding to its second dimension. Each of the row and/or column codewords may include BCH codes, Reed Solomon codes, or the like. Certain embodiments provide a novel technique for decoding multi-dimension TPC codes. The decoding technique described herein reduces hardware complexity and latency of the decoding process compared to other decoders in the art. In general, TPC decoding is an iterative decoding among different dimension error correcting codewords. As an example, if BCH codes are used as constituent codes for each dimension of TPC codes, the TPC decoder performs BCH decoding on multiple row codewords and multiple column codewords of the TPC code. Each BCH decoding may include several procedures, including syndrome calculation and Chien search procedures. Syndrome calculations and Chien search usually take large portions of the latency of BCH decoders. In order to reduce the latency and increase throughput, parallel architectures may be used in the decoder that may result in complex hardware, and high power consumption.

In one embodiment, a method is described for reducing number of times that syndrome calculation and/or Chien search are performed in the iterative decoding process. This results in significant savings in terms of latency and size of the decoder and increase in throughput of the decoder.

Figure 1:
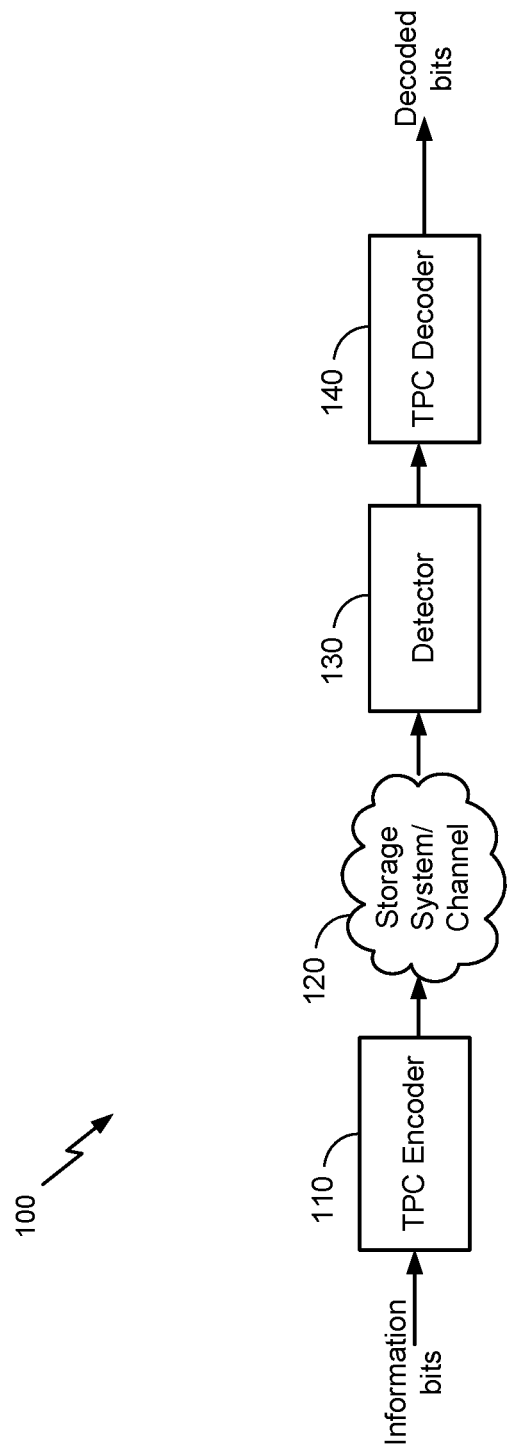
FIG. 1 illustrates an example high level block diagram of a turbo product code (TPC) error correcting system, in accordance with certain embodiments of the present disclosure.

FIG. 1 illustrates an example high level block diagram of a TPC error correcting system, in accordance with certain embodiments of the present disclosure. In the example shown, TPC encoder 110 receives information bits that include data which is desired to be stored in a storage system 120 or transmitted in a communications channel. TPC encoded data is output by TPC encoder 110 and is written to storage 120. In various embodiments, storage 120 may include a variety of storage types or media such as (e.g., magnetic) disk drive storage, Flash storage, etc. In some embodiments, the techniques described herein are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), detector 130 receives the data from the storage system. The received data may include some noise or errors. Detector 130 performs detection on the received data and outputs decision and/or reliability information corresponding to one or more bits in a codeword. For example, a soft-output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and/or reliability information is passed to TPC decoder 140 which performs TPC decoding using the decision and reliability information. A soft input decoder utilizes both the decision and the reliability information to decode the codeword. A hard decoder utilizes only the decision values in the decoder to decode the codeword. After decoding, the decoded bits generated by TPC decoder are passed to the appropriate entity (e.g., the user or application which requested it). With proper encoding and decoding, the information bits match the decoded bits.

Figure 2:
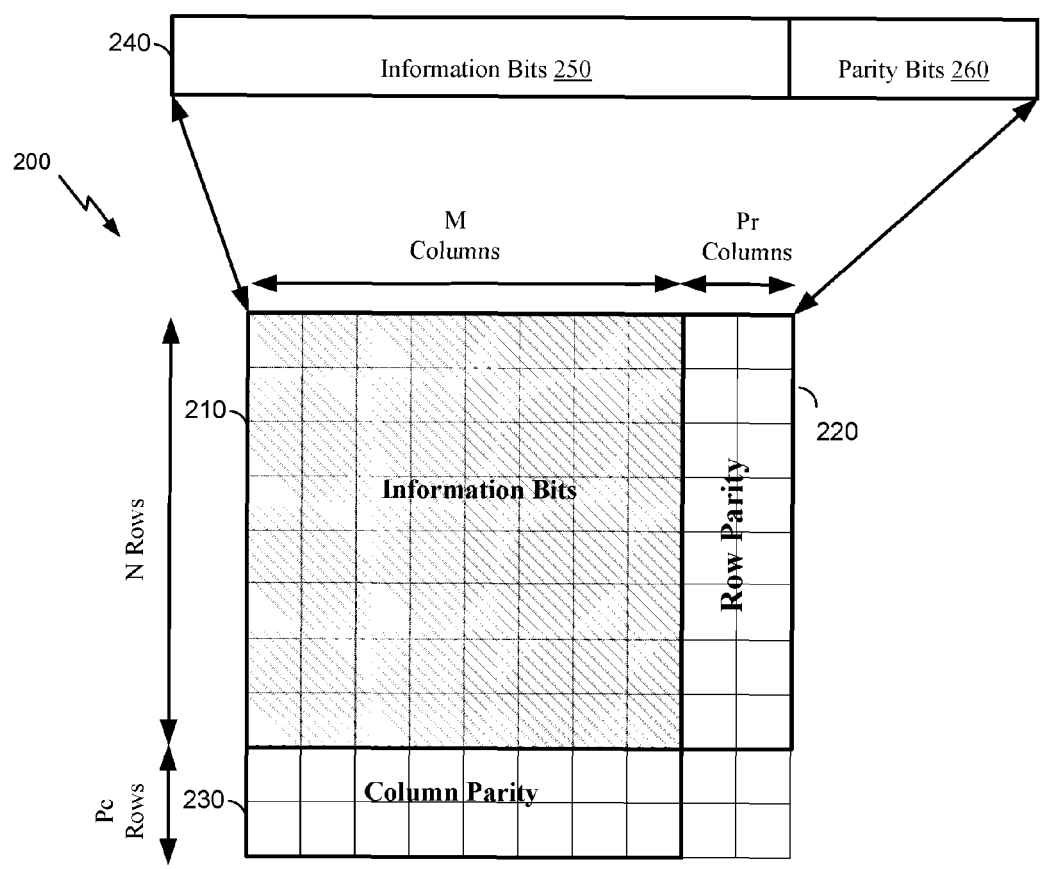
FIG. 2 illustrates an example block diagram of a TPC codeword, in accordance with certain embodiments of the present disclosure.

FIG. 2 illustrates an example block diagram of a two-dimensional TPC codeword 200, in accordance with certain embodiments of the present disclosure. As illustrated, the TPC codeword 200 may be a matrix of size $(N+P_c) \times (M+P_r)$, in which N represents number of rows of information bits, M represents number of columns of information bits, $P_r$ represents number of row parity bits and $P_c$ represents number of column parity bits. Information bits can be represented by a matrix of size N×M (e.g., matrix 210), row parity bits can be represented by a matrix of size $N \times P_r$ (e.g., matrix 220), and Column parity bits may be represented by a matrix of size $P_c \times M$ (e.g., matrix 230). The TPC codeword may include N row codewords and M column codewords. Each row codeword 240 includes multiple information bits 250 and one or more parity bits 260. Similarly, each column codeword includes multiple information bits and one or more parity bits. As an example, if row constituent code is a BCH code, the row codewords 1 through N are constructed using BCH encoding. Similarly, column codewords 1 through M are generated using an error correcting constituent code (e.g., BCH code, Reed Solomon code, etc.).

As an example, if the row constituent code has a code rate of 0.9, the row codeword may include 90 information bits and 10 parity bits. In general, row codewords and column codewords may have any code rate, without departing from the teachings of the present disclosure. To obtain the row and column parity bits, a TPC encoder (not shown) first encodes the N rows of information bits (shown as shaded blocks) to generate the N row parity bit groups. Then, the TPC encoder encodes the M columns of information bits to generate the M column parity bit sets.

Figure 3:
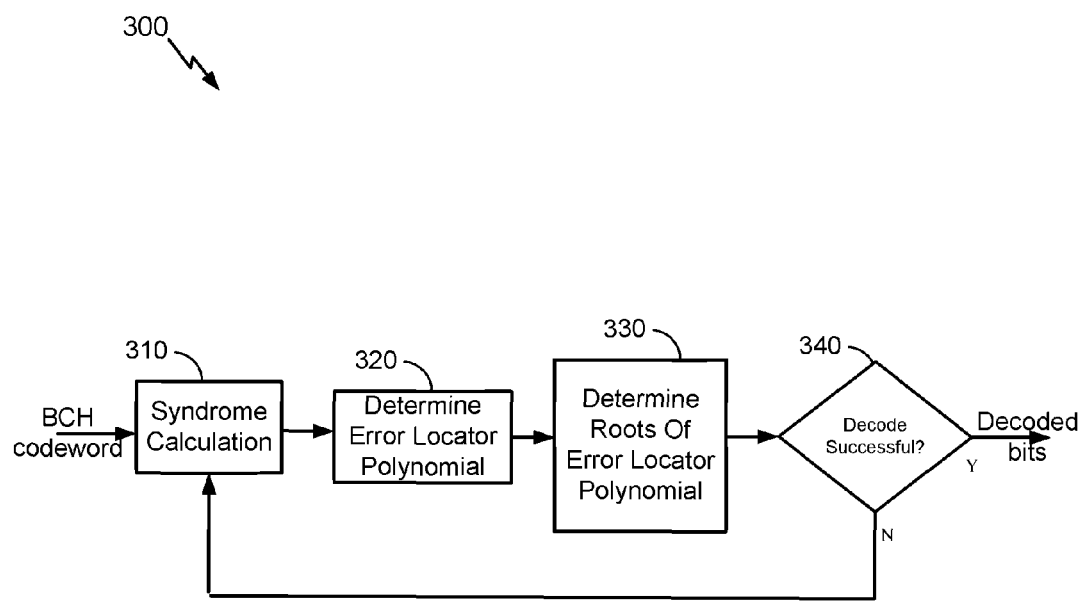
FIG. 3 illustrates an example Bose-Chaudhuri-Hocquenghem (BCH) decoder, in accordance with certain embodiments of the present disclosure.

FIG. 3 illustrates a high-level diagram of an example BCH decoder 300, in accordance with certain embodiments of the present disclosure. As illustrated, the decoder receives a BCH codeword and starts an iterative decoding process. For each iteration, BCH decoder performs syndrome calculation (step 310) on the received codeword, determines error locator polynomial (step 320), and performs Chien search or similar procedures to determine roots of error locator polynomial (step 330). Roots of the error locator polynomial provide an indication of where the errors in the codeword are located.

After correcting the errors, at 340, the decoder checks if the decoding process has resulted in a correct codeword. If yes, the decoder outputs the decoded bits. If not, the decoder may generate a bit flipping pattern, flip one or more bits of the codeword based on the pattern and calculate syndrome values of the new codeword. The decoding process may continue until a correct codeword is found and/or a predetermined maximum number of iterations is reached.

Given the natural numbers m and t, a t-error correcting binary BCH code of length $n=2^m-1$ may be defined as:

$$c(x) \in GF(2)[x]: \deg c(x) \leq n-1, c(\alpha)=c(\alpha^2)=c(\alpha^3)=\ldots =c(\alpha^{2t})=0$$

where $\alpha \in GF(2^m)$ is a primitive element. In other words, it is the set of all binary polynomials of degree at most $n-1$ such that when these are treated as polynomials over $GF(2^m)$, they must have $\alpha, \alpha^2, \alpha^3, \ldots, \alpha^{2t}$ as their roots.

If $c(x)$ is the transmitted codeword, $e(x)$ is the error polynomial, and $R(x)=c(x)+e(x)$ is the received codeword, then given that $\alpha, \alpha^2, \alpha^3, \ldots, \alpha^{2t}$ are roots of $c(x)$, an initial component syndrome may be calculated as:

$$S_i = r(\alpha^{i+1}) = e(\alpha^{i+1})$$

for $i=0, 1, \ldots, 2t-1$.

The error locator polynomial generator uses the syndromes $S_0, S_1, S_{2t-1}$ to generate the error location polynomial $\Lambda(x)$, which is defined as:

$$\Lambda(x) = \Pi_{i=1}^{v}(1-\alpha^{j_i}x)$$

Several methods exist in the art for finding the locator polynomial. For example, Berlekamp-Massey algorithm, Peterson's algorithm, and the like. The roots of the error location polynomial (i.e., $j_0, j_1, j_v$ in the equation above) indicate the locations of the errors, so finding the roots of the error location polynomial corresponds to finding the locations of the errors in a corresponding codeword.

Roots of the error location polynomial is usually found using Chien search. For binary symbols, once the error locations have been identified, correction simply involves flipping the bit at each identified error location. For non-binary symbols, the error magnitude needs to be calculated, for example, using Forney Algorithm, to find out the magnitude of the correction to be made.

In general, a TPC decoder may perform BCH decoding on one or more of the row constituent codes and/or column constituent codes iteratively to generate a correct TPC codeword.

Figure 4:
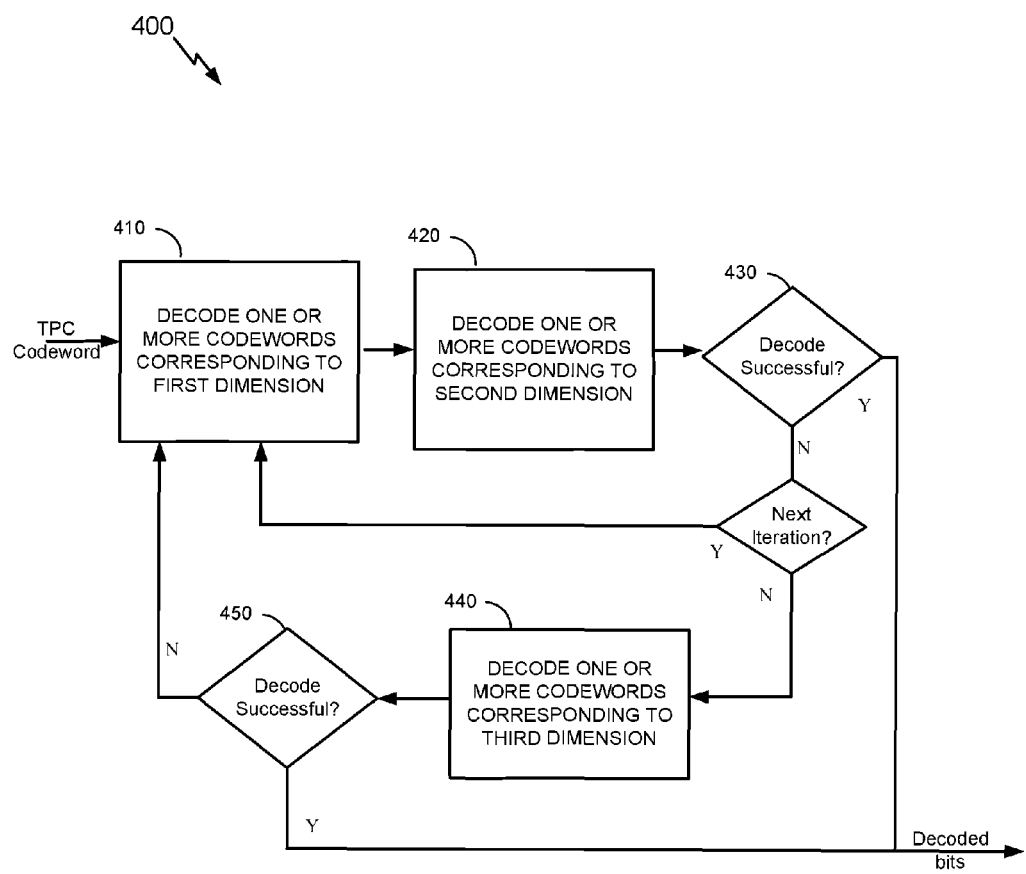
FIG. 4 illustrates an example three-dimensional TPC decoder, in accordance with certain embodiments of the present disclosure.

FIG. 4 illustrates an example three-dimensional TPC decoder 400, in accordance with certain embodiments of the present disclosure. The decoder receives a TPC codeword. At 410, the TPC decoder decodes one or more codewords corresponding to first dimension constituent code (e.g., row codeword) in the TPC codeword. As an example, for the TPC codeword as illustrated in FIG. 2, the decoder may decode one or more of the N row codewords. In one example, if each of the row constituent codewords is a BCH codeword, the TPC decoder performs BCH decoding on each of the row codewords.

In general, the TPC decoder may include any number of BCH decoders, without departing from the teachings of the present disclosure. As an example, depending on throughput and size requirements of the TPC decoder, the decoder may utilize a single BCH decoder to decode the N row codewords sequentially. Alternatively, the TPC decoder may include N BCH decoders that run in parallel to decode N row codewords in parallel. In another embodiment, the TPC decoder may include K BCH decoders, 1<K<N that run in parallel. The TPC decoder may utilize the K decoders one or more times to decode some or all the row codewords. In one example, N=30 and K=2.

At 420, the decoder may decode one or more codewords corresponding to the second dimension constituent code. For example, the decoder may decode one or more of the M column codewords. In one example, if each of the column codewords is a BCH codeword, the TPC decoder performs BCH decoding on each of the column codewords. At 430, the decoder checks if decoding has been successful or not. If yes, the decoding stops and the decoder outputs the decoded bits. If the TPC decoding has not been successful (e.g., the decoder did not converge to a correct codeword), the TPC decoder may iteratively perform decoding on the first dimension and/or second dimension codewords to correct errors. Alternatively at 440, the TPC decoder may decode one or more codewords corresponding to the third dimension. At 450, the TPC decoder checks if the decoding has been successful or not. If yes, the decoded bits are output from the decoder. If the decoding process has not been successful, the TPC decoder may perform another round of decoding on the first, second and third dimensions of the decoder to find a correct codeword. If the decoder reaches a maximum number of iterations, the decoding process may stop even if a correct codeword is not found.

In TPC decoding, syndrome values are usually calculated after receiving each codeword. In one embodiment, syndrome values may be updated based on previous syndrome values and corrected data. Thus, the syndrome calculation procedure may only be performed at the beginning of the decoding process. The syndromes corresponding to each of the codewords may be updated in subsequent iterations based on previous syndrome values.

Syndrome Updating Based Decoding

As described earlier, a BCH decoder may include three components, syndrome calculator, error locator polynomial determination (e.g., key equation solver) and Chien search. In general, the syndrome calculator calculates syndrome of the BCH code using a syndrome polynomial $S(x)=S_1+S_2X^1+S_3X^2+\ldots+S_{2t}X^{2t-1}$. The syndrome polynomial may be expressed as $S_j=R(\alpha^j)$ for $j=1\sim 2t$, where, $R(x)$ is the received codeword polynomial and $a$ is the primitive polynomial of $GF(2^m)$.

Since TPC decoding is an iterative decoding among different dimension BCH codewords, the received data might be modified while decoding codewords corresponding to other dimensions. In general, the TPC decoder receives the modified data and calculates the syndrome values for each dimension decoding. However, syndrome calculation process is very expensive on hardware and can be very time consuming.

In one embodiment, each syndrome may be calculated using previous syndrome values using the following equations:

$$P(x): S_j' = R'(\alpha_j) = R(\alpha_j) + P(\alpha_j) = S_j + P(\alpha_j).$$

In one embodiment, a low-complexity TPC hard decoder is disclosed using a syndrome-update decoding technique. In one embodiment, a row syndrome is generated from a row codeword, and a column syndrome is generated from a column codeword. In general, any type of syndrome calculation methods may be used to generate initial syndrome values when a new TPC codeword is received. One of the benefits to the TPC decoding technique described herein is that the syndromes do not need to be regenerated at each decoding iteration. Instead, one or more syndrome values are generated at the beginning of the TPC decoding procedure, and for each decoding iteration, new syndrome values are generated by updating the previous syndrome values. The syndrome update procedure results in savings in power, processing resources, and time compared to conventional TPC and/or BCH decoding procedures.

Figure 5:
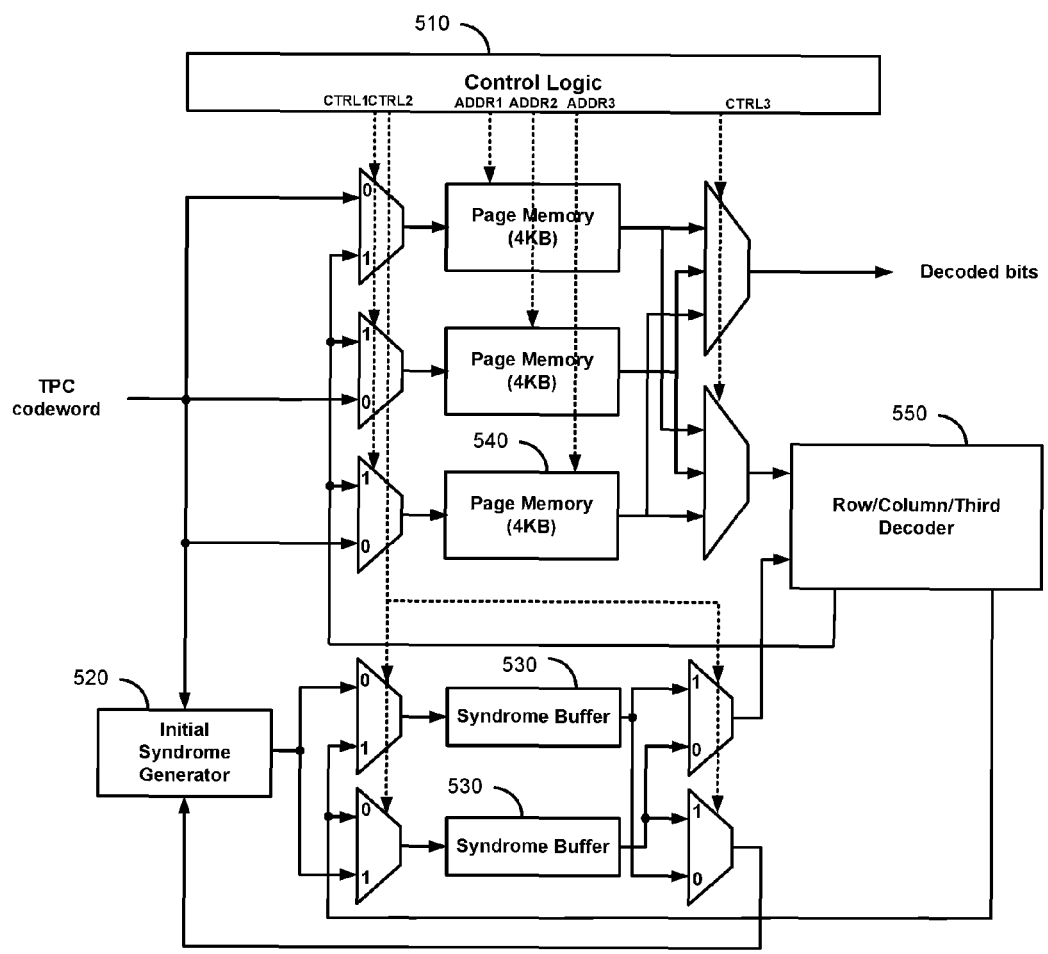
FIG. 5 illustrates an example block diagram of TPC hard decoder, according to one embodiment.

FIG. 5 illustrates an example high-level block diagram of a multi-dimension TPC hard decoder, according to one embodiment. In this example, the TPC decoder has three dimensions (e.g., row, column and third dimension). However, in general, the TPC decoder may have any number of dimensions without departing from the teachings of the present disclosure.

As illustrated, the TPC hard decoder has a control logic 510, an initial syndrome generator 520, one or more syndrome buffers 530, one or more page memories 540, and row/column/third decoder 550. The initial syndrome generator is used to generate initial values for the syndromes. For example, after receiving a new TPC codeword, the initial syndrome generator generates one or more syndromes for one or more dimension of the TPC decoder and stores them in the syndrome buffers 530. During the TPC decoding procedure, each dimension decoder (row/column/third decoder) utilizes the stored syndrome values to decode the codewords and correct errors.

In one embodiment, after finding an error pattern, the decoder corrects the data stored in the memories 540 and also updates the corresponding syndrome values stored in the syndrome buffers 530.

Figure 6:
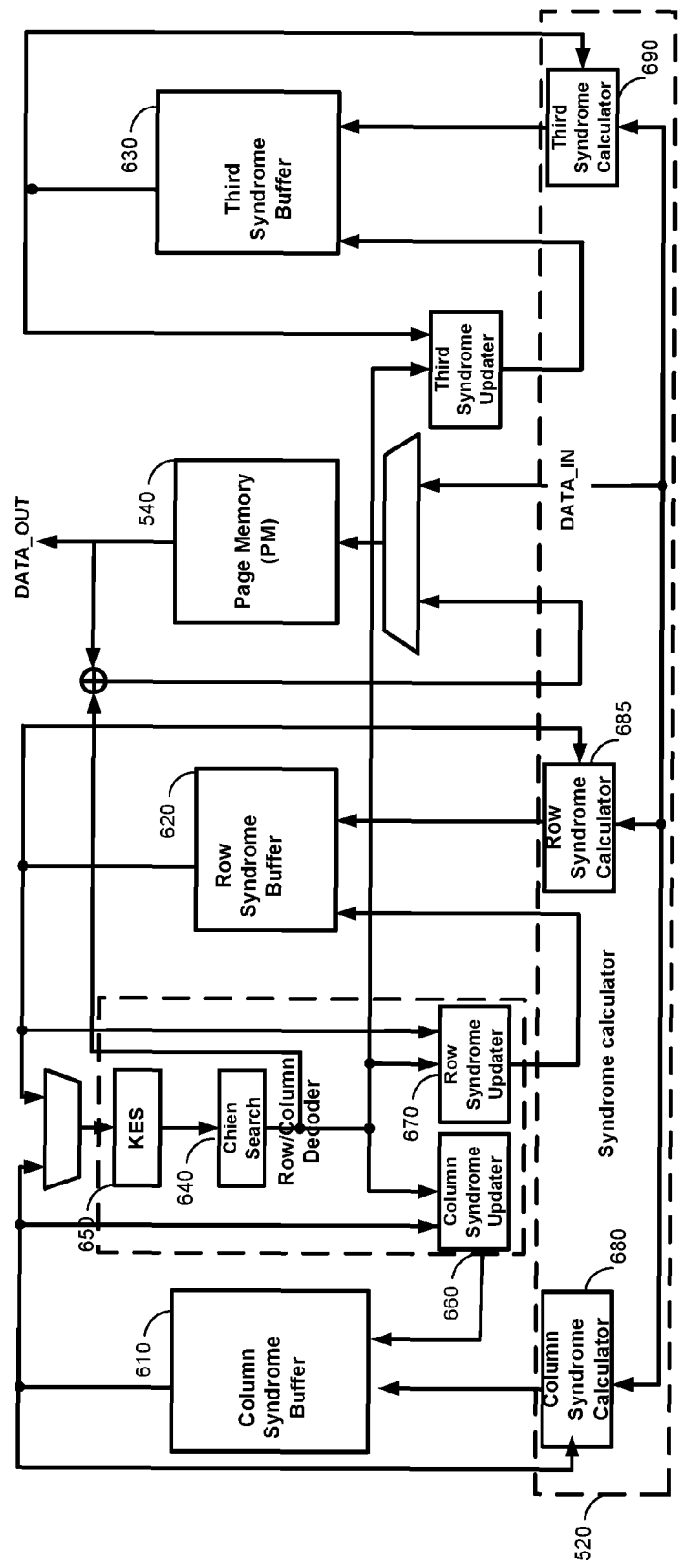
FIG. 6 illustrates an example row and/or column decoder, in accordance with certain embodiments of the present disclosure.

FIG. 6 illustrates an example row/column decoder, in accordance with certain embodiments of the present disclosure. As illustrated, the row/column decoder includes column syndrome buffer 610, row syndrome buffer 620, third syndrome buffer 630, Chien search 640, Key equation solver (KES) 650, column syndrome updater 660, row syndrome updater 670, and syndrome calculator 520, including row syndrome calculator 685, column syndrome calculator 680, and third dimension syndrome calculator 690. In one embodiment, the syndrome values are calculated by syndrome calculator 520 to initialize column syndrome buffer 610, row syndrome buffer 620, and third syndrome buffer 630. The row/column decoder reads syndrome values from row/column syndrome buffers during decoding iterations. After processing key equation solver 650 and Chien search 640, the decoder accesses page memory 540 and corrects the data based on the determined error patterns. Some or all of the row, column and/or third syndrome values are then updated in the column syndrome buffer 610, row syndrome buffer 620, third syndrome buffer 630.

In one embodiment, the key equation solver is used to carry out the error location polynomial σ(x), which may be defined as follows:

$$\sigma(x) = (1 + x\beta_1)(1 + x\beta_2) \ldots (1 + \beta_v) = 1 + \sigma_1 x^1 + \sigma_2 x^2 + \sigma_3 x^3 + \ldots + \sigma_v x^v.$$

The key equation describing the relation between S(x) and σ(x) may be derived as follows:

$$\Omega(x) = S(x) \times \sigma(x) \bmod x^{2t}$$

where Ω(x) is the error evaluator polynomial, S(x) represents syndrome polynomial, and t represents error correction capability of the code. Two of the popular methods for solving the key equation are Berlekamp-Massey and modified Euclidean algorithms. After the key equation solver, Chien search is applied to find the roots of the error location polynomial σ(x).

Figure 7:
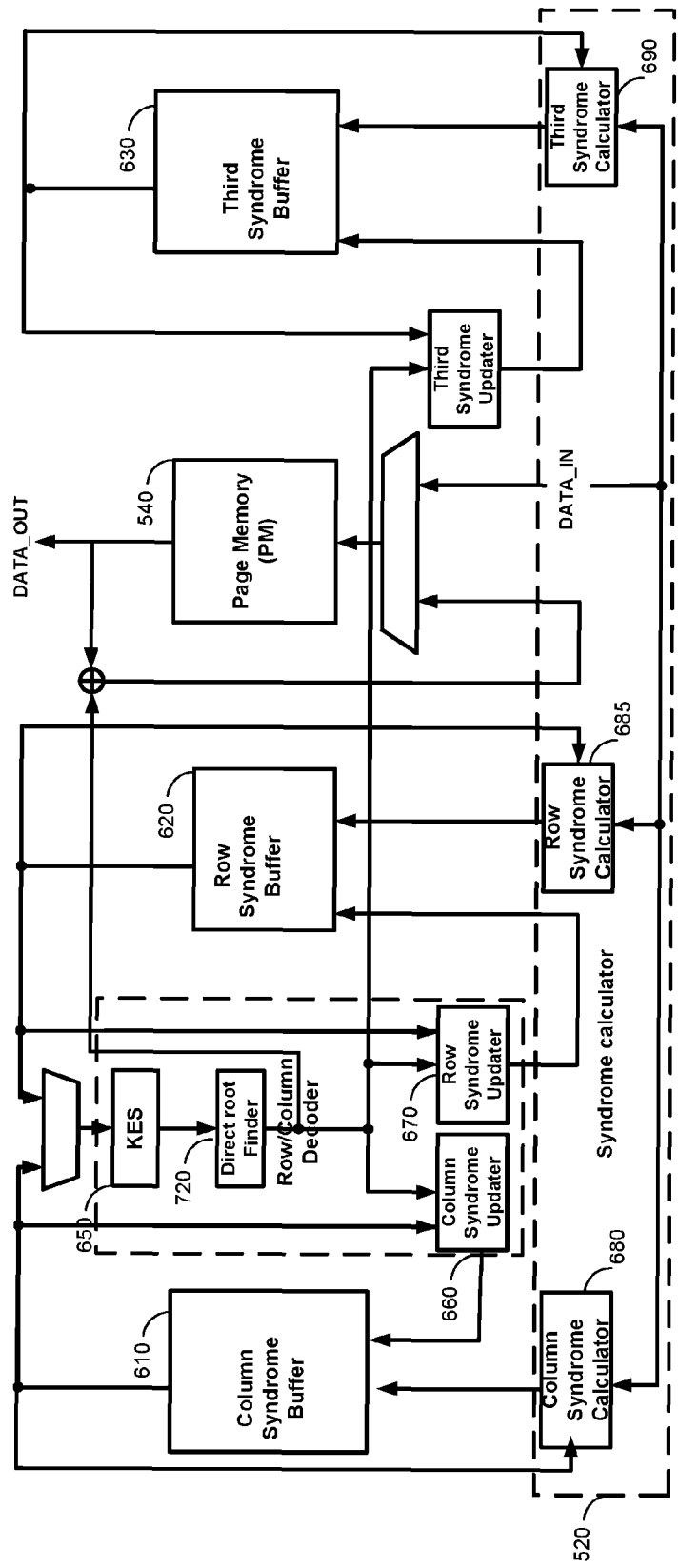
FIG. 7 illustrates an example third dimension decoder, in accordance with certain embodiments of the present disclosure.

FIG. 7 illustrates an example third dimension decoder, in accordance with certain embodiments of the present disclosure. Similar to the row/column decoders illustrated in FIG. 6, the third dimension decoder includes column syndrome buffer 610, row syndrome buffer 620, third syndrome buffer 630, Chien search 640, column syndrome updater 660, row syndrome updater 670, and syndrome buffer initiation 520, including row syndrome calculator 685, column syndrome calculator 680, and third dimension syndrome calculator 690. However, instead of the Chien search 640, as explained in more detail later, the third dimension decoder has Direct root finder 720. Operation of the third dimension decoder is similar to the operation of the row/column decoder, however, Chien search is replaced by direct root finder to find error location in one clock cycle.

Direct Root Finder for Low Degree Error Location Polynomial

In BCH decoding, Chien search is usually applied to find the roots of error location polynomial. To improve the latency and power, the roots of error location polynomial could be find directly without Chien search if the degree of error location polynomial is less than or equal to 2. The error location polynomial can be transformed from $\Lambda_2 x^2 + \Lambda_1 x + \Lambda_0$ to $y^2 + y + c$ for making computation easier on the hardware, where $$y = \frac{\Lambda_2}{\Lambda_1} x, \; c = \frac{\Lambda_2 \Lambda_0}{\Lambda_1^2}.$$

Certain embodiments provide a novel technique for finding one or more roots of error location polynomial of a BCH codeword in a single clock cycle. In one embodiment, when degree of error location polynomial corresponding to a BCH constituent code of the TPC code is less than or equal to 2, Chien search may be eliminated and roots of error location polynomial may be found directly from syndrome values. Furthermore, error protection of the ECC codes might be different for each dimension, for example, a TPC code, may have error correction capability of degree t1 for the first dimension, error correction capability degree of t2 for the second section and error correction capability of degree t3 for a third dimension. In one embodiment, error correction capability of a BCH code is equal to two, the key equation solver and direct root finder may be combined.

Figure 8:
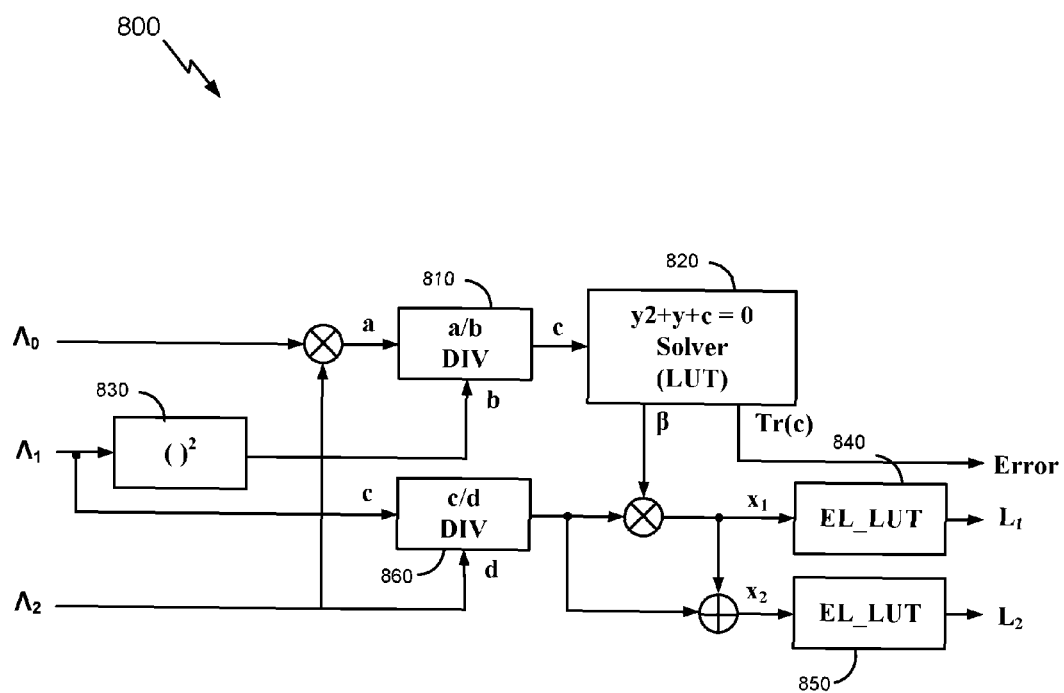
FIG. 8 illustrates an example direct root finder for a constituent code with error correction capability equal to two, in accordance with certain embodiments of the present disclosure.

FIG. 8 illustrates an example architecture for a direct root finder 800, corresponding to direct root finder block 720 in FIG. 7, for a constituent code with error correction capability equal to two, in accordance with certain embodiments of the present disclosure. As illustrated, the direct root finder includes division blocks 810 and 860, square root block 830, a degree two equation solver 820, and two error location look up tables EL-LUT 840 and EL-LUT 850. In this example, the error correction capability of the decoder is assumed to be equal to two, therefore, solving $y^2+y+c$ can be done with simple matrix computations in block 820, as shown in the example below.

In a $GF(2^{10})$ with primitive element $\alpha$ such that $\alpha^{10}+\alpha^3+1=0$, $Tr(\alpha^i)=0$ for all $0 \leq i \leq 9$ except for $i=7$. The trace function of $c \in GF(2^{10})$ can be calculated as follows:

$$Tr(c) = [0\ 0\ 0\ 0\ 0\ 0\ 0\ 1\ 0\ 0]c^T = c_7$$

Provided that $Tr(c)=0$, a solution (e.g., $\beta$) for $y^2+y+c=0$, may be given by the following equation:

$$\begin{bmatrix} 0 & 0 & 0 & 0 & 0 & 0 & 0 & 0 & 0 & 0 \\ 0 & 1 & 0 & 1 & 0 & 1 & 1 & 0 & 0 & 1 \\ 1 & 1 & 1 & 0 & 0 & 1 & 0 & 0 & 0 & 1 \\ 1 & 0 & 0 & 1 & 0 & 0 & 0 & 0 & 0 & 0 \\ 0 & 0 & 0 & 0 & 0 & 0 & 0 & 1 & 1 \\ 1 & 0 & 0 & 0 & 0 & 0 & 0 & 0 & 0 & 0 \\ 1 & 0 & 0 & 0 & 1 & 0 & 0 & 0 & 0 & 0 \\ 1 & 1 & 1 & 0 & 1 & 1 & 0 & 0 & 1 & 1 \\ 0 & 0 & 0 & 1 & 0 & 1 & 1 & 0 & 0 & 0 \\ 0 & 0 & 0 & 1 & 0 & 1 & 1 & 0 & 0 & 1 \end{bmatrix} \begin{bmatrix} c_0 \\ c_1 \\ c_2 \\ c_3 \\ c_4 \\ c_5 \\ c_6 \\ c_7 \\ c_8 \\ c_9 \end{bmatrix} = \begin{bmatrix} \beta_0 \\ \beta_1 \\ \beta_2 \\ \beta_3 \\ \beta_4 \\ \beta_5 \\ \beta_6 \\ \beta_7 \\ \beta_8 \\ \beta_9 \end{bmatrix}$$

Note that in the above matrix, the $i^{th}$ column (counting the leftmost column as zero) represents a root of $y^2+y+\alpha^i=0$, (if $Tr(\alpha^i)=0$) or a root of $y^2+y+\alpha^i+\alpha^{i7}=0$ (if $Tr(\alpha^i)=1$).

In one embodiment, look up tables 840 and 850 may be used to find the error location $j$ based on the root $x=\alpha^{-j}$. In one embodiment, if the degree of error location polynomial is equal to one, a look up table EL_LUT' can be applied to find the error location $j$ based on the syndrome value $S_1=\alpha^j$. The look-up tables that are used in the decoder corresponding to degree-one and degree-two decoders could be different. In one embodiment, the look-up tables corresponding to the degree-one decoder and degree-two decoder may be shared after performing the following mapping: In one embodiment, the error location polynomial can be re-defined as $\Lambda'(x)=\Lambda_0 x^2+\Lambda_1 x+\Lambda_2$ for the decoder with error correction capability equal to two. Therefore, the root can be written as $x=\alpha^j$. Therefore, the look-up tables can be shared between degree-one and degree-two decoders, which results in a compact architecture.

Figure 9:
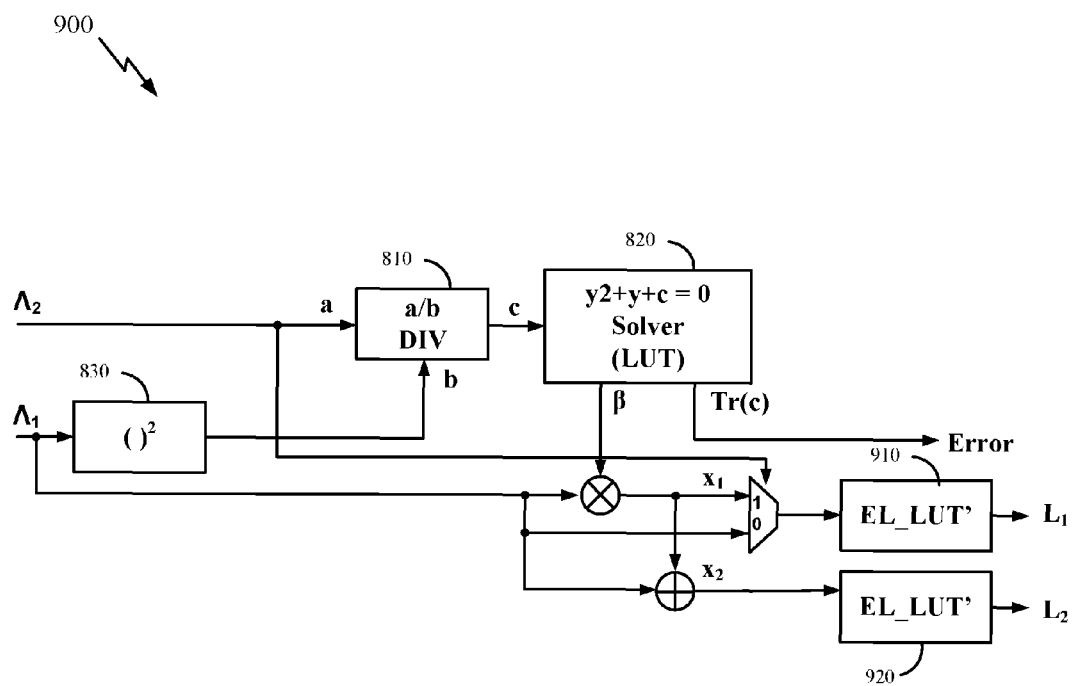
FIG. 9 illustrates an example direct root finder for a constituent code with error correction capability of one or two, in accordance with certain embodiments of the present disclosure.

FIG. 9 illustrates an example compact architecture for direct root finder 900 for a constituent code with error correction capability equal to one or two, in accordance with certain embodiments of the present disclosure. As illustrated, the direct root finder 900 is similar to the direct root finder 800 as shown in FIG. 8. The only difference is that there is only one divider block 810 since $\Delta_0$ is equal to one, and the lookup tables 910 and 920 store different values compared to the look up tables 840 and 850.

For certain embodiments, in a multiple dimensions TPC code, the error correction capability of each of the constituent codes for different dimensions could be different. For example, a first dimension may have an error correction capability equal to 5, the second dimension could have error correction capability equal to 4 and the third dimension could have error correction capability equal to two. It should be noted that there is a trade-off between error correction capability of the decoder and size and latency of the decoder. Therefore, a decoder with higher error correction capability may be more expensive in hardware. For certain embodiments, the constituent code used in the first dimension may have higher error correction capability than the constituent codes used in other dimensions.

In one embodiment, the third dimension constituent code may have error correction capability equal to two. Therefore, the hardware architecture for two-error correcting BCH codes may be optimized to reduce its size. For example, for two-error-correcting BCH codes, the key equation solver 650 may be combined with direct root finder 720, as follows. In general, Berlekamp-Massey (BM) algorithm or Extended Euclidean algorithm are utilized to compute key equation solver (KES) for BCH codes. However, for two-error-correcting BCH codes, it is more efficient to apply Peterson-Gorenstein-Zieler algorithm to calculate the coefficients of error location polynomial $\Lambda(x)$, as follows:

$$\Lambda_0 = 1, \Lambda_1 = S_1, \Lambda_2 = \frac{S_3 + S_1^3}{S_1}$$

However, calculating the inversion operation may be expensive in hardware. To simplify the hardware, the coefficients can be redefined in a form that does not include any inversion operation:

$$\Lambda_0 S_1, \Lambda_1 = S_1^2, \Lambda_2 = S_3 + S_1^3$$

Figure 10:
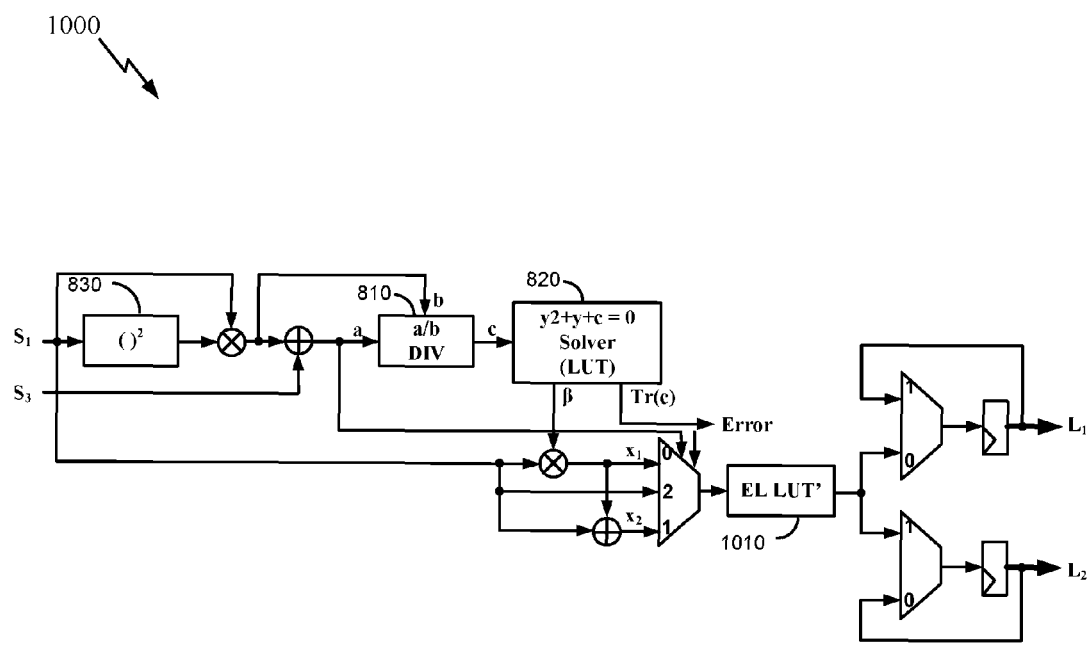
FIG. 10 illustrates an example one shot decoder for directly finding error location from syndrome values, in accordance with certain embodiments of the present disclosure.

FIG. 10 illustrates an example one-shot decoder 1000 for directly finding error location from syndrome values, in accordance with certain embodiments of the present disclosure. As illustrated, the syndrome values $S_1$ and $S_3$ are input to the one shot decoder. Error locations L1 and L2 are output from the decoder in either one or two clock cycles. It should be noted that if error correction capability of the decoder is equal to one, only location of one error is sent out of the decoder (e.g., L1). This can be done in a single clock cycle.

In one embodiment, to further optimize the hardware and support both one error and two errors cases, only one EL_LUT' 1010 may be used in the decoder. In this case, two clock cycles may be used to calculate error locations. It should be noted that if two look-up tables are used in the decoder (similar to FIG. 9), then the error locations could be determined in one clock cycle. The one shot decoder architecture in FIG. 10, provides a simple yet novel architecture to find error locations in one or two clock cycles. The proposed architecture improves the latency and throughput with reduced area on the silicon.

Figure 11:
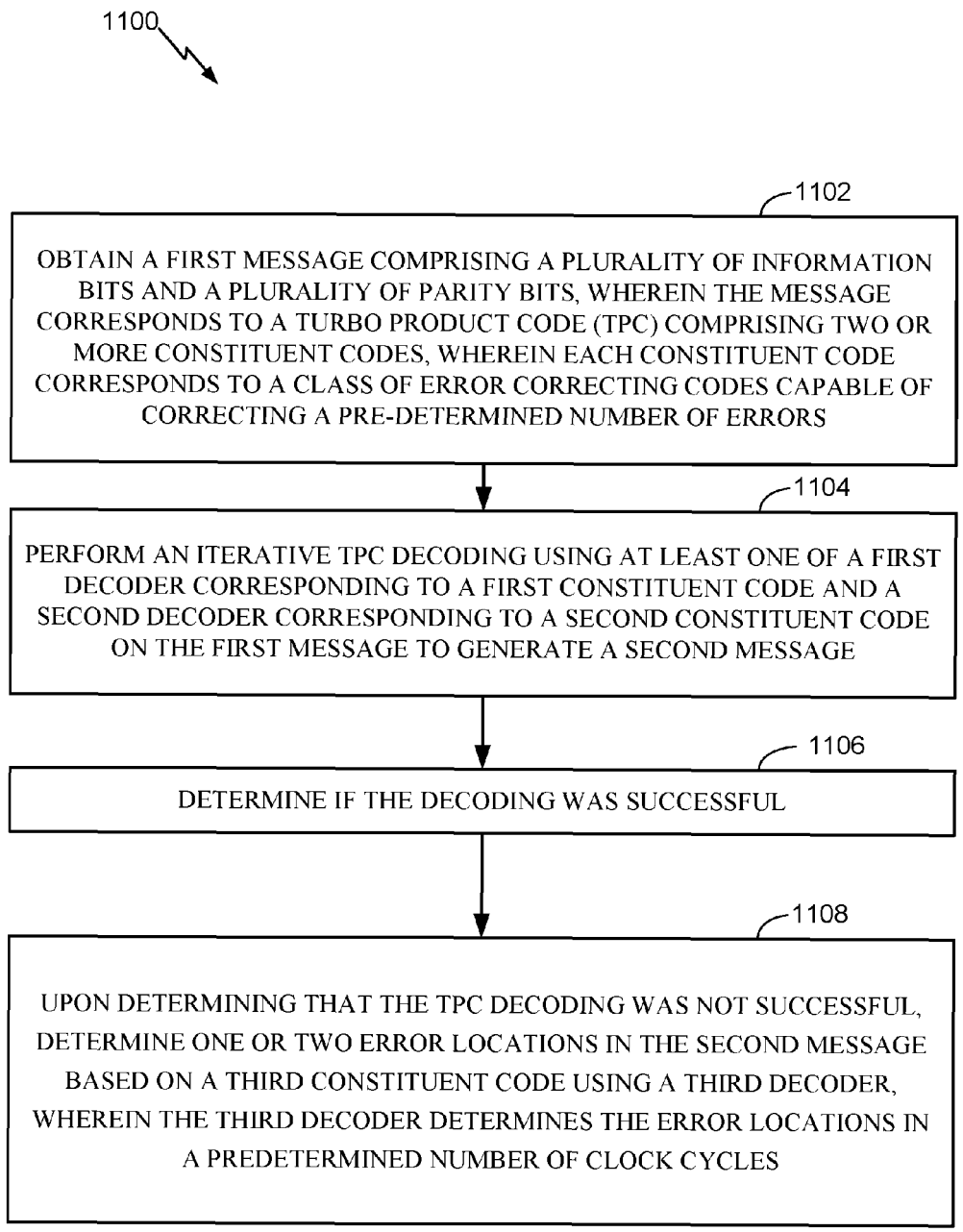
FIG. 11 illustrates example operations that may be performed by a device to decode a TPC codeword, in accordance with certain embodiments of the present disclosure.

FIG. 11 illustrates example operations that may be performed by a device to decode a TPC codeword, in accordance with certain embodiments of the present disclosure. As illustrated, at 1102, the device obtains a first message comprising a plurality of information bits and a plurality of parity bits. The message may correspond to a TPC codeword including two or more constituent codes. Each constituent code may correspond to a class of error correcting codes capable of correcting a pre-determined number of errors. At 1104, the device performs an iterative TPC decoding using at least one of a first decoder corresponding to a first constituent code and a second decoder corresponding to a second constituent code on the first message to generate a second message. At 1106, the device determines if the decoding was successful or not. At 1108, upon determining that the TPC decoding was not successful, the device determines one or more error locations in the second message based on a third constituent code using a third decoder, wherein the third decoder determines the one or more error locations in a predetermined number of clock cycles. In one embodiment, the predetermined number of clock cycles is one cycle. In another embodiment, the predetermined number of clock cycles is two cycles. In general, the predetermined number of clock cycles is a small integer number.

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

Figure 12:
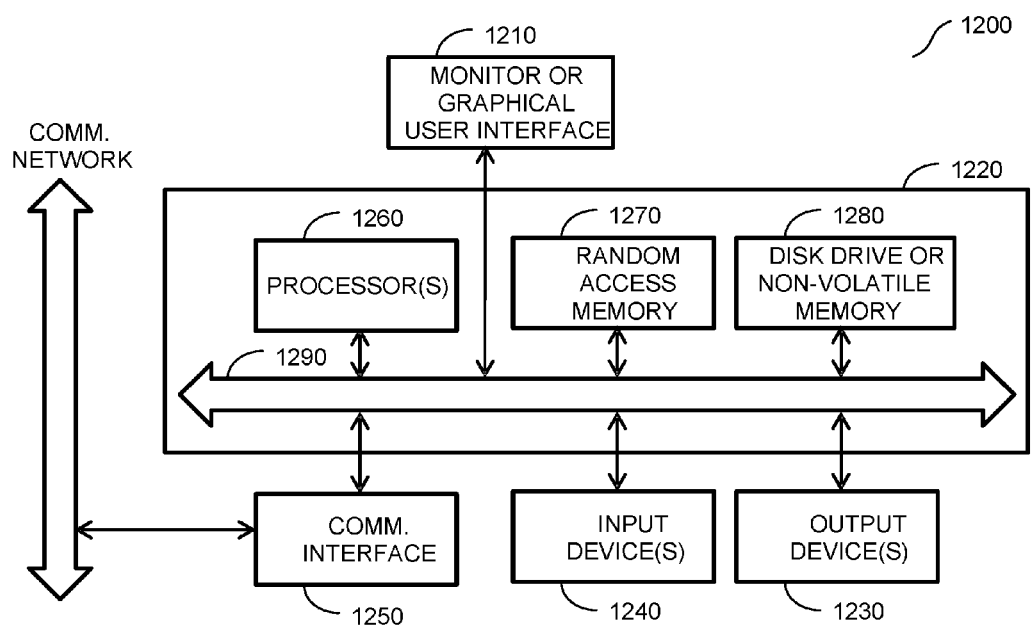
FIG. 12 describes one potential implementation of a device which may be used to decode a TPC codeword, according to one embodiment.

FIG. 12 describes one potential implementation of a device which may be used to decode a codeword, according to certain embodiments. FIG. 12 is merely illustrative of an embodiment incorporating the present invention and does not limit the scope of the invention as recited in the claims. One of ordinary skill in the art would recognize other variations, modifications, and alternatives. In one embodiment, computer system 1200 typically includes a monitor 1210, a computer 1220, user output devices 1230, user input devices 1240, communications interface 1250, and the like.

As shown in FIG. 12, computer 1220 may include a processor(s) 1260 that communicates with a number of peripheral devices via a bus subsystem 1290. These peripheral devices may include user output devices 1230, user input devices 1240, communications interface 1250, and a storage subsystem, such as random access memory (RAM) 1270 and disk drive 1280.

User input devices 1230 include all possible types of devices and mechanisms for inputting information to computer system 1220. These may include a keyboard, a keypad, a touch screen incorporated into the display, audio input devices such as voice recognition systems, microphones, and other types of input devices. In various embodiments, user input devices 1230 are typically embodied as a computer mouse, a trackball, a track pad, a joystick, wireless remote, drawing tablet, voice command system, eye tracking system, and the like. User input devices 1230 typically allow a user to select objects, icons, text and the like that appear on the monitor 1210 via a command such as a click of a button or the like.

User output devices 1240 include all possible types of devices and mechanisms for outputting information from computer 1220. These may include a display (e.g., monitor 1210), non-visual displays such as audio output devices, etc.

Communications interface 1250 provides an interface to other communication networks and devices. Communications interface 1250 may serve as an interface for receiving data from and transmitting data to other systems. Embodiments of communications interface 1250 typically include an Ethernet card, a modem (telephone, satellite, cable, ISDN), (asynchronous) digital subscriber line (DSL) unit, FireWire interface, USB interface, and the like. For example, communications interface 1250 may be coupled to a computer network, to a FireWire bus, or the like. In other embodiments, communications interfaces 1250 may be physically integrated on the motherboard of computer 1220, and may be a software program, such as soft DSL, or the like.

In various embodiments, computer system 1200 may also include software that enables communications over a network such as the HTTP, TCP/IP, RTP/RTSP protocols, and the like. In alternative embodiments of the present invention, other communications software and transfer protocols may also be used, for example IPX, UDP or the like. In some embodiments, computer 1220 includes one or more Xeon microprocessors from Intel as processor(s) 1260. Further, one embodiment, computer 1220 includes a UNIX-based operating system.

RAM 1270 and disk drive 1280 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 1270 and disk drive 1280 may be configured to store the basic programming and data constructs that provide the functionality of the present invention.

Software code modules and instructions that provide the functionality of the present invention may be stored in RAM 1270 and disk drive 1280. These software modules may be executed by processor(s) 1260. RAM 1270 and disk drive 1280 may also provide a repository for storing data used in accordance with the present invention.

RAM 1270 and disk drive 1280 may include a number of memories including a main random access memory (RAM) for storage of instructions and data during program execution and a read only memory (ROM) in which fixed non-transitory instructions are stored. RAM 1270 and disk drive 1280 may include a file storage subsystem providing persistent (non-volatile) storage for program and data files. RAM 1270 and disk drive 1280 may also include removable storage systems, such as removable flash memory.

Bus subsystem 1290 provides a mechanism for letting the various components and subsystems of computer 1220 communicate with each other as intended. Although bus subsystem 1290 is shown schematically as a single bus, alternative embodiments of the bus subsystem may utilize multiple busses.

FIG. 12 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An apparatus for decoding, comprising:
   a memory;
   a processor coupled to the memory, the processor configured to:
   obtain a first message comprising a plurality of information bits and a plurality of parity bits, wherein the first message corresponds to a turbo product code (TPC) comprising two or more constituent codes, wherein each constituent code corresponds to a class of error correcting codes capable of correcting a pre-determined number of errors;
   perform an iterative TPC decoding using at least one of a first decoder corresponding to a first constituent code and a second decoder corresponding to a second constituent code on the first message to generate a second message;
   determine if the iterative TPC decoding was successful; and
   upon determining that the TPC decoding was not successful, determine one or more error locations in the second message based on a third constituent code using a third decoder, wherein the third decoder determines the one or more error locations in a predefined number of clock cycles based on an additional iterative TPC decoding on the second message, wherein the additional iterative TPC decoding comprises:
   generating a syndrome of the third constituent code in an initial iteration based on the second message;
   updating a value of the syndrome by at least using the one or more error locations determined in the initial iteration; and
   decoding the second message in a next iteration based on the updated value of the syndrome.

2. The apparatus of claim 1, wherein the third decoder determines the one or more error locations directly from one or more syndrome values without performing a search.

3. The apparatus of claim 1, wherein the processor is further configured to:

generate at least one of a first set of syndrome values corresponding to the first constituent code and a second set of syndrome values corresponding to the second constituent code based on the first message.

4. The apparatus of claim 3, wherein the processor is further configured to:
   perform a first set of decoding operations corresponding to the first decoder on the first message using the first set of syndrome values to generate a third message;
   generate an adjusted set of syndrome values by adjusting at least one of the syndrome values in the second set of syndrome values based on the third message; and
   perform a second set of decoding operations corresponding to the second decoder on the third message using the adjusted set of syndrome values to generate the second message.

5. The apparatus of claim 1, wherein the processor is further configured to:
   correct the second message based on the one or more error locations to generate a third message;
   iteratively perform decoding operations on the third message using at least one of the first decoder or the second decoder.

6. The apparatus of claim 1, wherein one or more of the first constituent code or the second constituent code correspond to a Bose-Chaudhuri-Hocquenghem (BCH) code.

7. The apparatus of claim 1, wherein the predefined number of clock cycles is less than or equal to two clock cycles.

8. A method for decoding, comprising:
   obtaining a first message comprising a plurality of information bits and a plurality of parity bits, wherein the first message corresponds to a turbo product code (TPC) comprising two or more constituent codes, wherein each constituent code corresponds to a class of error correcting codes capable of correcting a pre-determined number of errors;
   performing an iterative TPC decoding using at least one of a first decoder corresponding to a first constituent code and a second decoder corresponding to a second constituent code on the first message to generate a second message;
   determining if the iterative TPC decoding was successful; and
   upon determining that the TPC decoding was not successful, determining one or more error locations in the second message based on a third constituent code using a third decoder, wherein the third decoder determines the one or more error locations in a predefined number of clock cycles based on an additional iterative TPC decoding on the second message, wherein the additional iterative TPC decoding comprises:
   generating a syndrome of the third constituent code in an initial iteration based on the second message;
   updating a value of the syndrome by at least using the one or more error locations determined in the initial iteration; and
   decoding the second message in a next iteration based on the updated value of the syndrome.

9. The method of claim 8, wherein the third decoder determines the one or more error locations directly from one or more syndrome values without performing a search.

10. The method of claim 8, further comprising:
    generating at least one of a first set of syndrome values corresponding to the first constituent code and a second set of syndrome values corresponding to the second constituent code based on the first message.

11. The method of claim 10, further comprising:
performing a first set of decoding operations corresponding to the first decoder on the first message using the first set of syndrome values to generate a third message;
generating an adjusted set of syndrome values by adjusting at least one of the syndrome values in the second set of syndrome values based on the third message; and
performing a second set of decoding operations corresponding to the second decoder on the third message using the adjusted set of syndrome values to generate the second message.

12. The method of claim 8, further comprising:
correcting the second message based on the one or more error locations to generate a third message;
iteratively performing decoding operations on the third message using at least one of the first decoder or the second decoder.

13. The method of claim 8, wherein one or more of the first constituent code or the second constituent code correspond to a Bose-Chaudhuri-Hocquenghem (BCH) code.

14. The method of claim 8, wherein the predefined number of clock cycles is less than or equal to two clock cycles.

15. A non-transitory processor-readable medium for decoding, comprising processor-readable instructions configured to cause one or more processors to:
obtain a first message comprising a plurality of information bits and a plurality of parity bits, wherein the first message corresponds to a turbo product code (TPC) comprising two or more constituent codes, wherein each constituent code corresponds to a class of error correcting codes capable of correcting a pre-determined number of errors;
perform an iterative TPC decoding using at least one of a first decoder corresponding to a first constituent code and a second decoder corresponding to a second constituent code on the first message to generate a second message;
determine if the iterative TPC decoding was successful; and
upon determining that the TPC decoding was not successful, determine one or more error locations in the second message based on a third constituent code using a third decoder, wherein the third decoder determines the one or more error locations in a predefined number of clock cycles based on an additional iterative TPC decoding on the second message, wherein the additional iterative TPC decoding comprises:
generating a syndrome of the third constituent code in an initial iteration based on the second message;
updating a value of the syndrome by at least using the one or more error locations determined in the initial iteration; and
decoding the second message in a next iteration based on the updated value of the syndrome.

16. The non-transitory processor-readable medium of claim 15, wherein the third decoder determines the one or more error locations directly from one or more syndrome values without performing a search.

17. The non-transitory processor-readable medium of claim 15, wherein the processor-readable instructions are further configured to cause one or more processors to:
generate at least one of a first set of syndrome values corresponding to the first constituent code and a second set of syndrome values corresponding to the second constituent code based on the first message.

18. The non-transitory processor-readable medium of claim 17, wherein the processor-readable instructions are further configured to cause one or more processors to:
perform a first set of decoding operations corresponding to the first decoder on the first message using the first set of syndrome values to generate a third message;
generate an adjusted set of syndrome values by adjusting at least one of the syndrome values in the second set of syndrome values based on the third message; and
perform a second set of decoding operations corresponding to the second decoder on the third message using the adjusted set of syndrome values to generate the second message.

19. The non-transitory processor-readable medium of claim 15, wherein the processor-readable instructions are further configured to cause one or more processors to:
correct the second message based on the one or more error locations to generate a third message;
iteratively perform decoding operations on the third message using at least one of the first decoder or the second decoder.

20. The non-transitory processor-readable medium of claim 15, wherein one or more of the first constituent code or the second constituent code correspond to a Bose-Chaudhuri-Hocquenghem (BCH) code.

* * * * *